US009084382B2

United States Patent
Standing

(10) Patent No.: US 9,084,382 B2
(45) Date of Patent: Jul. 14, 2015

(54) METHOD OF EMBEDDING AN ELECTRONIC COMPONENT INTO AN APERTURE OF A SUBSTRATE

(71) Applicant: Infineon Technologies Austria AG, Villach (AT)

(72) Inventor: Martin Standing, Villach (AT)

(73) Assignee: Infineon Technologies Austria AG, Villach (AT)

( * ) Notice: Subject to any disclaimer, the term of this patent is extended or adjusted under 35 U.S.C. 154(b) by 39 days.

(21) Appl. No.: 13/654,456

(22) Filed: Oct. 18, 2012

(65) Prior Publication Data

US 2014/0111955 A1 Apr. 24, 2014

(51) Int. Cl.
*H01K 3/10* (2006.01)
*H05K 3/46* (2006.01)
*H05K 1/18* (2006.01)

(52) U.S. Cl.
CPC .............. *H05K 3/4697* (2013.01); *H05K 1/185* (2013.01); *H01L 2924/0002* (2013.01); *H05K 3/4652* (2013.01); *H05K 2203/063* (2013.01); *H05K 2203/1469* (2013.01); *Y10T 29/49158* (2015.01)

(58) Field of Classification Search
CPC ... H05K 1/185; H05K 1/4652; H05K 3/4697; H05K 2203/063; H05K 2203/1489; H01L 2924/0002; Y10T 29/49158
USPC .................. 29/825, 830, 832, 840, 846, 852
See application file for complete search history.

(56) References Cited

U.S. PATENT DOCUMENTS

| | | | |
|---|---|---|---|
| 6,734,535 B1 * | 5/2004 | Hashimoto | 257/668 |
| 6,953,999 B2 * | 10/2005 | Strandberg et al. | 257/778 |
| 8,186,046 B2 * | 5/2012 | Tanaka | 29/832 |
| 2001/0052647 A1 * | 12/2001 | Plepys et al. | 257/738 |
| 2002/0001937 A1 * | 1/2002 | Kikuchi et al. | 438/618 |
| 2005/0218491 A1 * | 10/2005 | Sasaki et al. | 257/678 |
| 2009/0242252 A1 * | 10/2009 | Tanaka | 174/260 |
| 2012/0170240 A1 * | 7/2012 | Tanaka | 361/783 |

* cited by examiner

*Primary Examiner* — Carl Arbes
(74) *Attorney, Agent, or Firm* — SpryIP, LLC

(57) ABSTRACT

Representative implementations of devices and techniques provide improved electrical access to components, such as chip dice, for example, disposed within layers of a multi-layer printed circuit board (PCB). One or more insulating layers may be located on either side of a spacer layer containing the components. The insulating layers may have apertures strategically located to provide electrical connectivity between the components and conductive layers of the PCB.

9 Claims, 17 Drawing Sheets

METHOD OF EMBEDDING AN ELECTRONIC COMPONENT INTO AN APERTURE OF A SUBSTRATE

BACKGROUND

Developments in semiconductor technologies over the last few years have allowed the Figure of Merit (FoM) and circuit efficiency to be maintained, or even in some cases improved, as the size of a semiconductor device continually shrinks. One of the modern semiconductor technologies that use a shrinking form factor is embedded die technology. An integrated circuit (IC) chip die, for example, may be located within a core layer of a printed circuit board (PCB), or between layers of a multi-layer circuit board, for example. This technique frees up surface area on the PCB layer surfaces for other circuit components. In some cases, multiple chip dice may be located within different layers or sets of layers of a multi-layer PCB.

Electrical connections between embedded components and outer layers of the PCB are sometimes managed by boring through laminated layers, after encapsulating the components within the layers, to create contacts to the components. In some cases, lasers are used to remove organic/organic glass mixtures or inorganic substrates of the layers. However, these techniques may be too aggressive or invasive for some embedded components. For example, the boring techniques may create less precise connection channels and may cause damage or reliability issues with some embedded components.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

FIG. 2A shows two example dielectric layers and FIG. 2B shows the dielectric layers after an adhesive has been applied to them.

DETAILED DESCRIPTION

Overview

Representative implementations of devices and techniques provide improved electrical access to components, such as chip dice, for example, disposed within layers of a multi-layer printed circuit board (PCB). In an example, one or more insulating layers may be located on either side of a spacer layer containing the components. The insulating layers may have apertures strategically located to provide electrical connectivity between the components and conductive layers of the PCB. For example, in an implementation, the conductive layers may be located as outside layers of the multi-layer PCB.

In an implementation, the spacer layer may include pre-formed apertures arranged to hold the components. The components may be disposed within the pre-formed apertures of the spacer layer and electrically coupled to portions of one or more of the conductive layers via other pre-formed apertures of the insulating layers. For example, the insulating layers may be formed with apertures arranged to provide a channel from the embedded component(s) to the conductive layer(s).

In some implementations, the multi-layer PCB may be formed by sequential build up technologies, including processes of adding sequences of layers one onto the other. In an implementation, the layers of the multi-layer PCB are symmetrically arranged on either side of the spacer layer and the embedded component(s).

Various implementations and arrangements are discussed with reference to electrical and electronics components and varied carriers. While specific components (i.e., integrated circuit chip dice, resistors, capacitors, inductors, chokes, etc.) are mentioned, this is not intended to be limiting, and is for ease of discussion and illustrative convenience. The techniques and devices discussed with reference to a chip die are applicable to any type or number of electrical components (e.g., sensors, transistors, diodes, etc.), circuits (e.g., integrated circuits, analog circuits, digital circuits, mixed circuits, ASICS, memory devices, processors, etc.), groups of components, packaged components, structures, and the like, that may be fully or partially embedded within a carrier, such as a layered printed circuit board (PCB). Additionally, the techniques and devices discussed with reference to a printed circuit board (PCB) are applicable to other types of carriers (e.g., board, chip, wafer, substrate, package, container, can, module, etc.) that the chip die may be mounted fully or partially on or within.

Implementations are explained in more detail below using a plurality of examples. Although various implementations and examples are discussed here and below, further implementations and examples may be possible by combining the features and elements of individual implementations and examples.

Example Multi-Layer PCB

Figure 1:
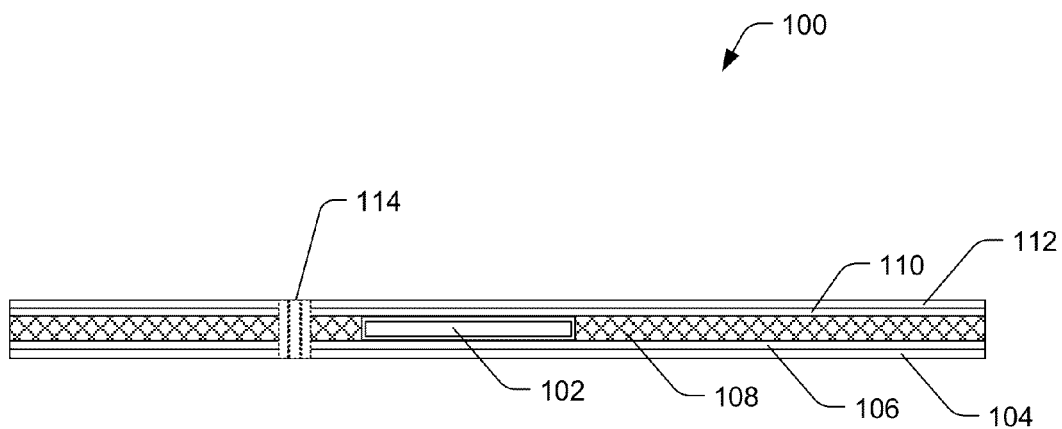
FIG. 1 is a cross-sectional profile view of a multi-layer PCB arrangement including embedded circuit components, according to an example.

FIG. 1 is a cross-sectional profile view of an example multi-layer PCB arrangement 100 including an example embedded circuit component 102. In various implementations, the PCB arrangement 100 may include one or more components 102.

The arrangement 100 represents an example environment whereby the techniques and devices discussed herein may be applied. For example, the component 102 represents any and all electrical devices that may be located (e.g., partially or fully embedded, etc.) within layers of a PCB arrangement 100. The techniques, components, and devices described herein with respect to the arrangement 100 are not limited to the illustrations in FIGS. 1-6 and 8-14, and may be applied to other designs, types, arrangements, and constructions including other electrical components without departing from the scope of the disclosure. In some cases, alternative components may be used to implement the techniques described herein. In various implementations, the arrangement 100 may be a stand-alone module, or it may be a portion of a system, component, structure, or the like.

In an implementation, the PCB arrangement 100 is comprised of multiple layers (layers 104, 106, 108, 110, and 112, for example). In various implementations, the PCB arrangement 100 may have one, two, or three layers, or it may be comprised of five or more layers or sets of layers, as shown in FIGS. 1-6 and 8-14. In some implementations, the arrangement 100 may have fewer or a greater number of layers than that shown in FIGS. 1-6 and 8-14.

In one implementation, the PCB arrangement 100 includes a first conductive layer 104 and a second conductive layer 112. In some implementations, the first and second conductive layers 104 and 112 are comprised of a conductive material or an insulating material with conductive tracks formed thereon. For example, the first and second conductive layers 104 and 112 may be etched copper, or the like. In one implementation, the first and second conductive layers 104 and 112 are comprised of metallic foil, such as gold or copper sheets, for example.

In an implementation, the PCB arrangement 100 includes a first dielectric layer 106 and a second dielectric layer 110 disposed between the first and second conductive layers 104 and 112. In some implementations, at least one of the first and second dielectric layers 106 and 110 has one or more apertures. For example, in one implementation, the apertures are pre-formed. In other words, the apertures are formed within the first and second dielectric layers 106 and 110 prior to assembly of the PCB arrangement 100. In another implementation, the apertures are formed as the first and second dielectric layers 106 and 110 are formed. In a further implementation, the apertures are formed as the PCB arrangement 100 is formed or assembled. Various such implementations are discussed further below.

In an implementation, the PCB arrangement 100 includes a spacer layer 108 disposed between the first and second dielectric layers 106 and 110. In an implementation, the spacer layer has one or more apertures. For example, in one implementation, the apertures are pre-formed. In other words, the apertures are formed within the spacer layer 108 prior to assembly of the PCB arrangement 100. In another implementation, the apertures are formed as the spacer layer 108 is formed. In a further implementation, the apertures are formed as the PCB arrangement 100 is formed or assembled. Various such implementations are discussed further below.

In various implementations the number and size of the apertures of the spacer layer 108 depend on the number and size of the component(s) 102 to be embedded within the PCB arrangement 100. For example, apertures may be formed within the spacer layer to accommodate the size and shape of the components 102. Additionally, the thickness of the spacer layer 108 may be arranged to be substantially similar to the thickness of the component(s) 102. For example, the spacer layer 108 in combination with the component(s) 102 may form a substantially planar surface on one or both of the sides/surfaces.

A pair of outer layers (i.e., first and second conductive layers 104 and 112), a pair of inner layers (i.e., first and second dielectric layers 106 and 110) and a spacer layer 108 may comprise a set of layers, for example. In an implementation, the PCB arrangement 100 may be symmetrical about the spacer layer 108. For example, the number and type of layers on one side of the spacer layer 108 may be similar or substantially the same as the number and type of layers on the other side of the spacer layer 108, as illustrated in FIG. 1. In other implementations, the PCB arrangement 100 may include one or more additional layers, such as insulating layers for example, situated between layers or sets of layers.

In various implementations, electrical components 102 (such as one or more IC chip dice, for example) are located between layers of the arrangement 100, and may be embedded within a layer, such as the spacer layer 108, as shown in FIGS. 1-6 and 8-14. In various implementations, as discussed above, the components 102 may include components such as integrated circuit (IC) chip dice, transistors, diodes, semiconductor devices, resistors, inductors, capacitors, and so forth.

In one implementation, the components 102 are located fully within the layers of the PCB arrangement 100. In an alternate implementation, one or more of the components 102 are located partially within the layers of the PCB arrangement 100. For example, one or more surfaces of the components 102 may be exposed or extend outside of a layer of the PCB arrangement 100 while the components 102 are located partially within the layer. One embedded component 102 is shown in FIGS. 1-6 and 8-14 for illustration. In various implementations, a PCB arrangement 100 may have any number of partially or fully embedded components 102.

In an implementation, the one or more electrical components 102 are disposed within the one or more pre-formed apertures of the spacer layer 108. For example, the apertures of the spacer layer 108 may be designed, formed, cut, or otherwise arranged to fit the size and shape of the one or more electrical components 102.

In the implementation, the components 102 are electrically coupled to at least a portion of the first conductive layer 104 or the second conductive layer 112 (or both layers 104, 112) through the one or more pre-formed apertures of the first dielectric layer 106 or the second dielectric layer 110, or both layers 106, 110. For example, the apertures in the first and second dielectric layers 106 and 110 are arranged as a channel for connections to the component(s) 102 from the outer layers 104, 112. In various implementations, conductive tracks may be formed within the channels of the apertures in the first and second dielectric layers 106 and 110, where the conductive tracks couple the outer layers 104, 112 to contacts on the component(s) 102.

In various implementations, the apertures in the first and second dielectric layers 106 and 110 are arranged to provide all of the connection channels used by the component(s) 102 to any of the layers of the PCB arrangement 100, without boring or drilling through layers to connect to embedded component(s) 102.

In an alternate implementation, the PCB arrangement 100 includes one or more through vias 114 drilled through each of the layers (104, 106, 108, 110, and 112, for example), and plated with a conductive material. In the implementation, the vias 114 couple components mounted to one layer with components mounted to another layer of the PCB arrangement 110. In various implementations, the vias 114 may be global vias, extending through all layers of the PCB arrangement 100, or they may be blind vias, extending through one or more layers, but not fully through all layers of the PCB arrangement 100.

In an implementation, as discussed above, the multi-layer PCB arrangement 100 is formed using sequential build up technologies, including adding a sequence of layers, as discussed further below. In an implementation, one or more of the layers in the sequence (such as first and second dielectric layers 106 and 110, for example) have pre-formed apertures to form access channels for electrical contacts to the embedded component(s) 102.

Different configurations for a PCB arrangement 100 may be possible with different implementations. In alternate implementations, various other combinations and designs of the arrangement 100 are also within the scope of the disclosure. The variations may have fewer elements than illustrated in the examples shown in FIGS. 1-6 and 8-14, or they may have more or alternative elements than those shown.

Representative Processes

Figure 7:
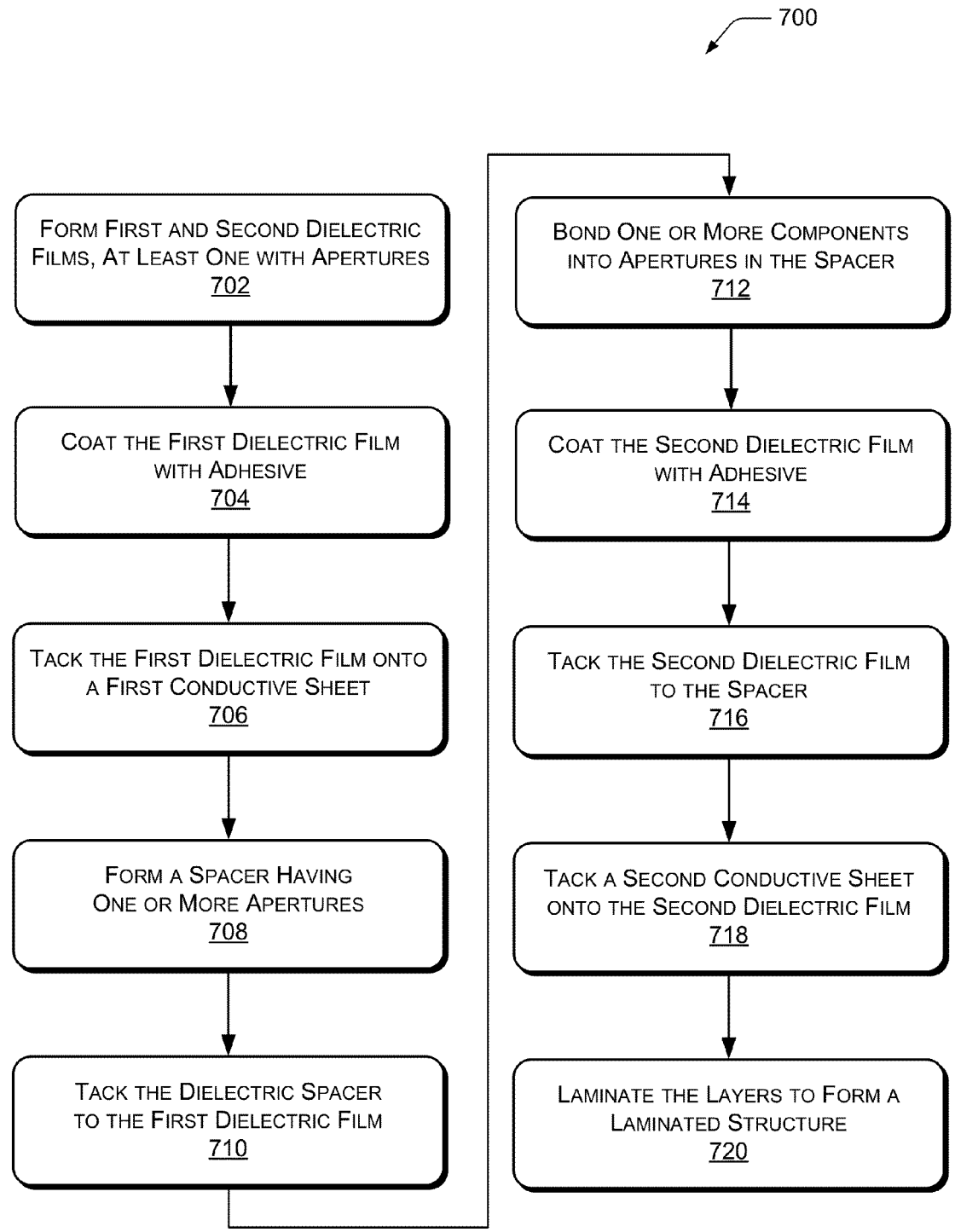
FIG. 7 is a flow diagram illustrating an example process for improving electrical access to components, such as chip dice for example, disposed within layers of a multi-layer PCB, according to an implementation.
Figure 15:
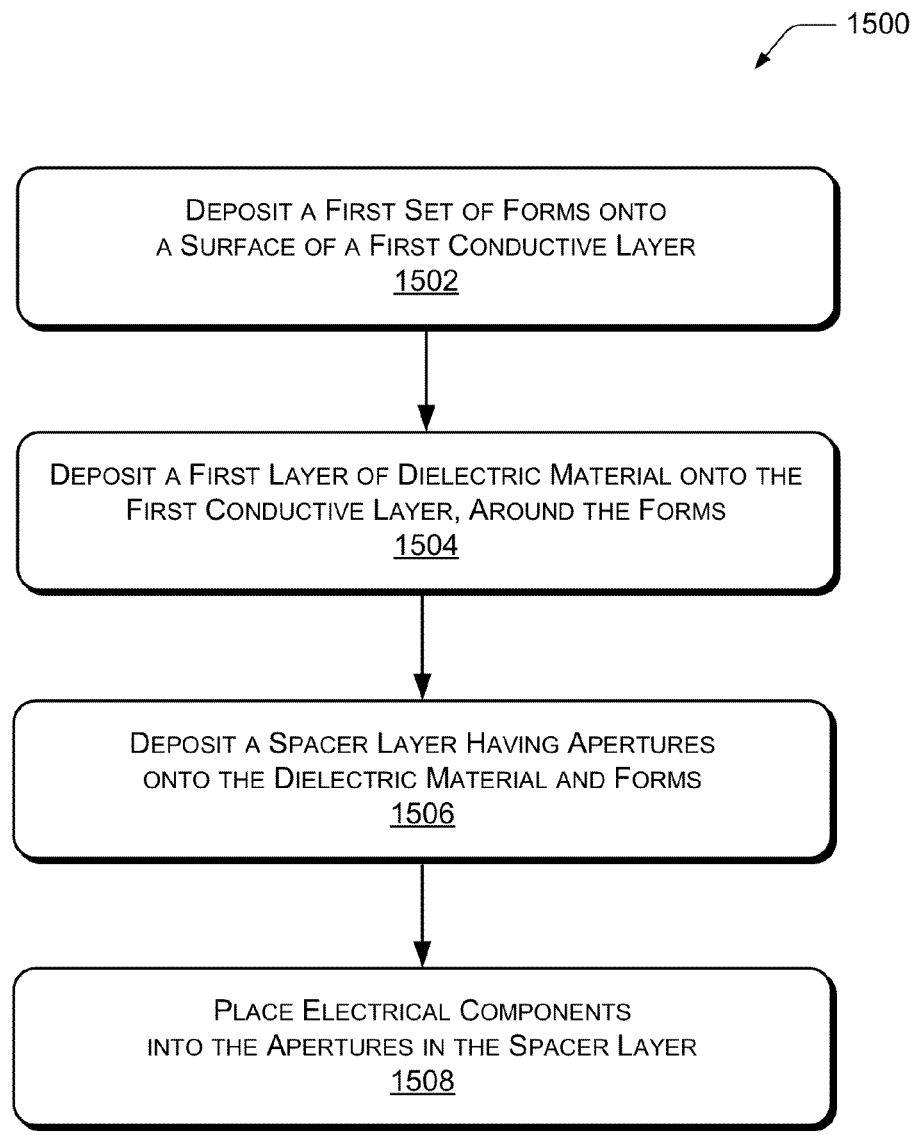
FIG. 15 is a flow diagram illustrating an example process for improving electrical access to components, such as chip dice for example, disposed within layers of a multi-layer PCB, according to another implementation.

FIGS. 7 and 15 illustrate representative processes 700 and 1500 for improving electrical access to an embedded electrical component (such as component 102, for example) located within a carrier (such as PCB arrangement 100, for example), according to various implementations. In alternate implementations, the PCB arrangement may have any number of layers. In some implementations, the component(s) may be partially or fully embedded within layers of the PCB arrangement.

In example implementations, the processes 700 and 1500 may result in a symmetrical layered structure by using sequential build-up technologies. This relatively inexpensive and flexible technique can produce apertures of any desired size and shape and conductive circuit paths of varying weights (i.e., track thickness). In various implementations, the processes 700 and 1500 may be used on small or large scale to manufacture single circuit arrangements to panels having multiple circuits per panel.

FIG. 7 illustrates a first representative process 700. The process 700 is described with reference to FIGS. 1-6. The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 702, the process includes forming a first dielectric film (such as dielectric layer 106, for example) and a second dielectric film (such as dielectric layer 110, for example). In an implementation, at least one of the first and second dielectric films has one or more apertures (such as apertures 202 in FIG. 2A, for example). In various implementations, the first dielectric film and/or the second dielectric film may comprise a material such as polyimide, epoxy, reinforced epoxy, bismaleimide, Polytetrafluoroethylene (PTFE), or the like.

Figure 2A:
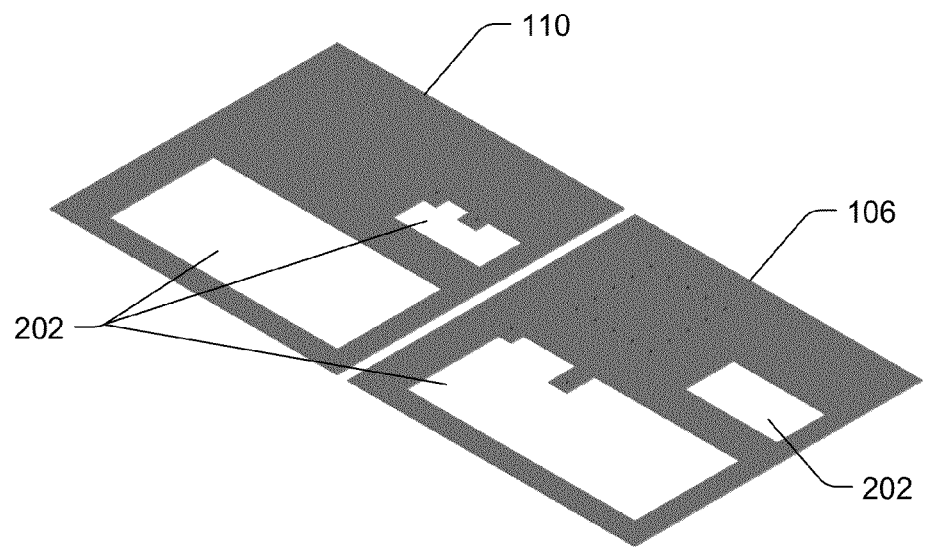
FIGS. 2A and 2B are perspective views of PCB layers of FIG. 1, for example.
Figure 2B:
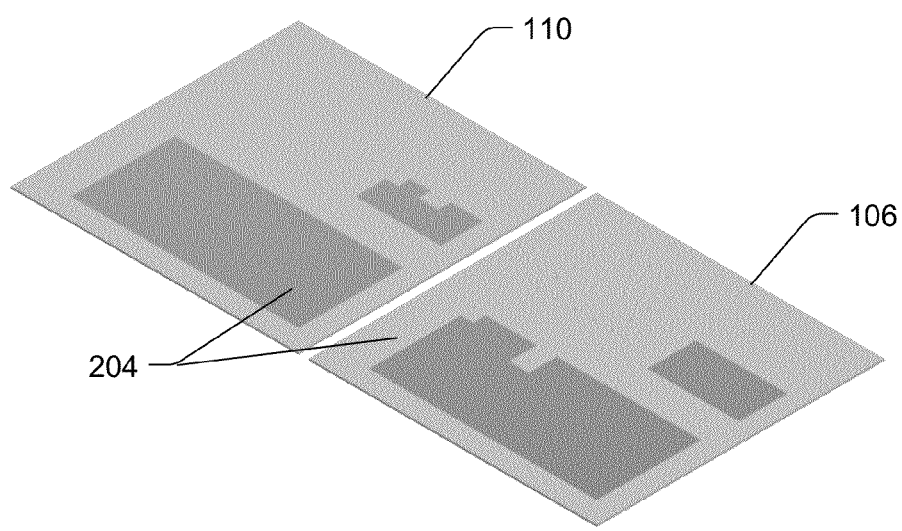

At block 704, the process includes coating the first dielectric film with an adhesive (such as adhesive 204 in FIG. 2A, for example). In one implementation, the first and second dielectric films are both coated with adhesive, as shown in FIG. 2B. In an implementation, the dielectric film(s) are coated such that the adhesive fills any apertures in the first (or second) dielectric film. For example, the process may include fully coating all surfaces of the first dielectric film and the second dielectric film with adhesive, where the adhesive comprises one of: epoxy, acrylate, a thermo-setting resin, a silicone polymer, a silicone resin, or similar adhesive. In one implementation, a photo-sensitive initiator is incorporated in the adhesive, and is arranged to block thermally induced cross-linking of the adhesive, where the adhesive has been exposed to ultra-violet (UV) light.

Figure 3A:
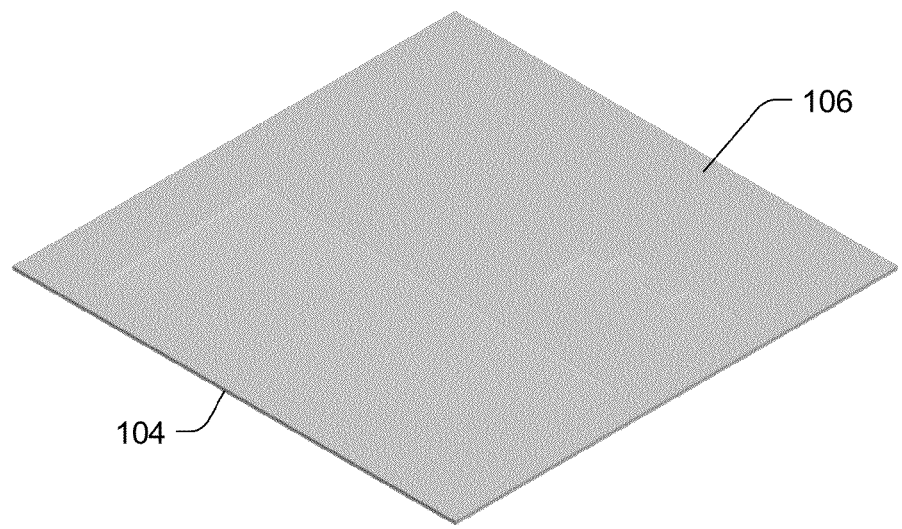
FIG. 3A is a perspective view of one of the PCB layers of FIG. 2B, having been tacked to a conductive layer, according to an implementation.

At block 706, the process includes tacking the first dielectric film onto a first conductive sheet (such as conductive layer 104, for example), as shown in FIG. 3A, for example. Tacking, for instance, includes temporarily bonding one or more layers together in a number of areas using pressure or pressure and heat, and similar techniques of holding layers in alignment during assembly. Tacking may be used to retain layers of a laminated structure prior to laminating the layers into the structure.

Figure 3B:
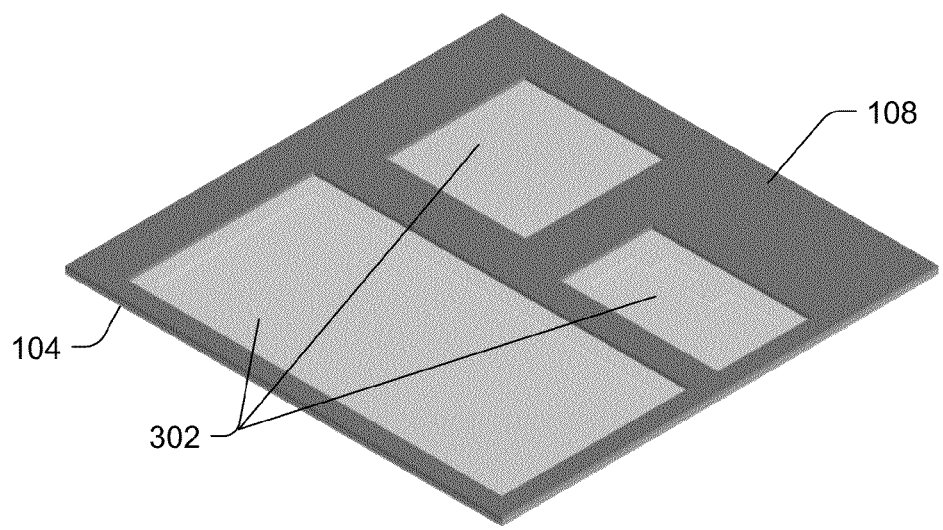
FIG. 3B is a perspective view of the example PCB assembly of FIG. 3A, with the addition of a spacer layer tacked to the dielectric layer, according to an implementation.

At block 708, the process includes forming a spacer (such as spacer layer 108, for example) having one or more apertures (such as apertures 302 in FIG. 3B, for example). In an example, the spacer may be constructed of dielectric material, or the like. In an alternate implementation, the spacer may include a metallic component, or the like. In an implementation, the spacer may have a thickness substantially the same as the components to be embedded, so that the layer is planar within the assembly when the components are added. At block 710, the process includes tacking the spacer to the first dielectric film, as shown in FIG. 3B, for example.

Figure 4A:
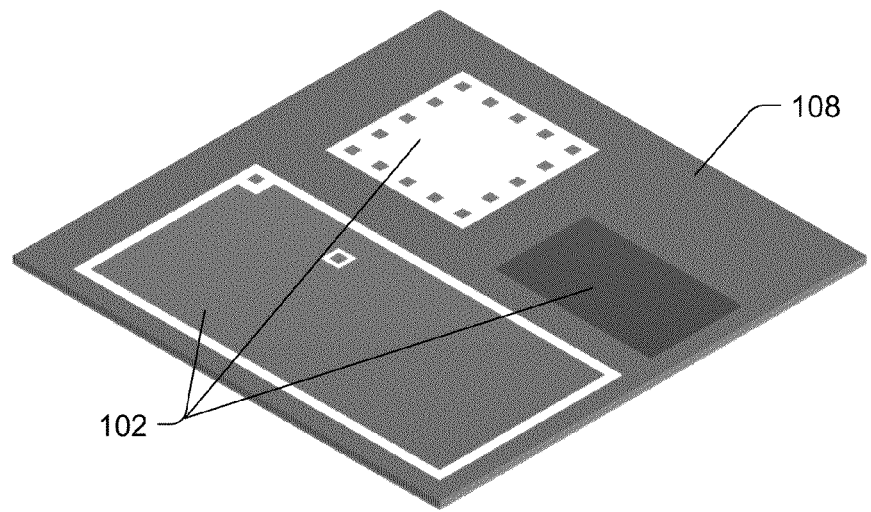
FIG. 4A is a perspective view of the PCB assembly of FIG. 3B, showing example electrical components bonded into apertures of the spacer layer, according to an implementation.

At block 712, the process includes bonding one or more electrical components (such as components 102, for example) into the one or more apertures in the spacer, as shown in FIG. 4A, for example. As discussed previously, the process may include arranging the spacer and the one or more electrical components to form a substantially planar surface. This may include forming the spacer having a predetermined thickness and with one or more apertures of predetermined size and shape.

Figure 4B:
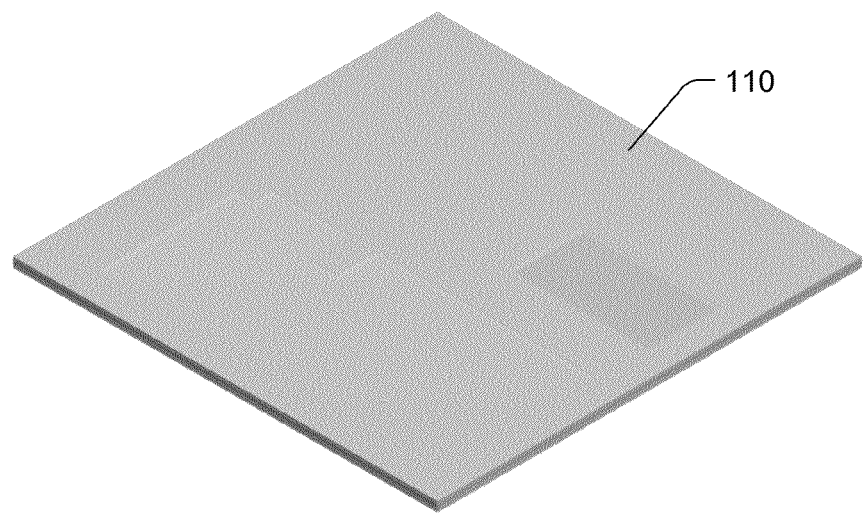
FIG. 4B is a perspective view of the example PCB assembly of FIG. 4A, showing a second dielectric layer tacked to the spacer/component layer, according to an implementation.

At block 714, the process includes coating the second dielectric film with the adhesive, if this has not occurred previously. As above, in an implementation, the adhesive fills any apertures in the second dielectric film. At block 716, the process includes tacking the second dielectric film to the dielectric spacer, as shown in FIG. 4B, for example. At block 718, the process includes tacking a second conductive sheet (such as conductive layer 112, for example) onto the second dielectric film.

Figure 5A:
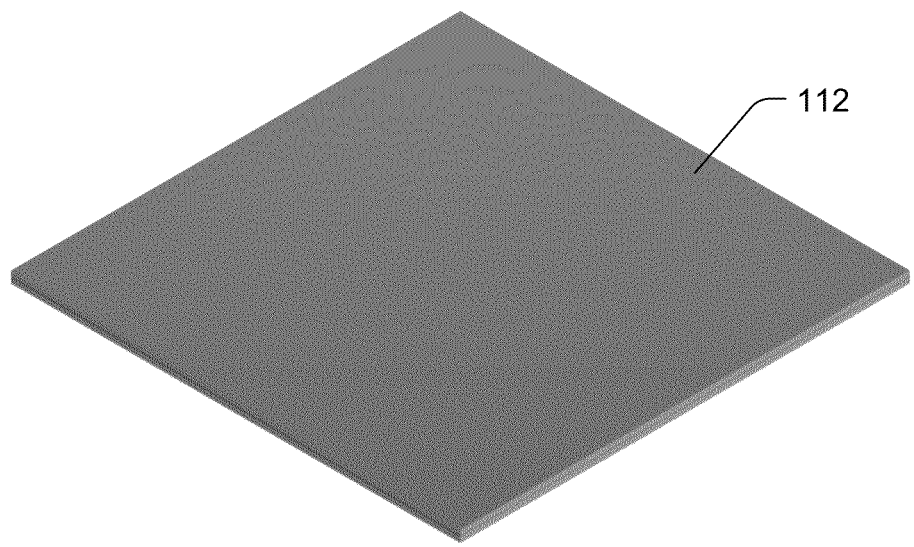
FIG. 5A is a perspective view of the PCB assembly of FIG. 4B, showing a second conductive layer tacked to the second dielectric layer, according to an implementation.
Figure 5B:
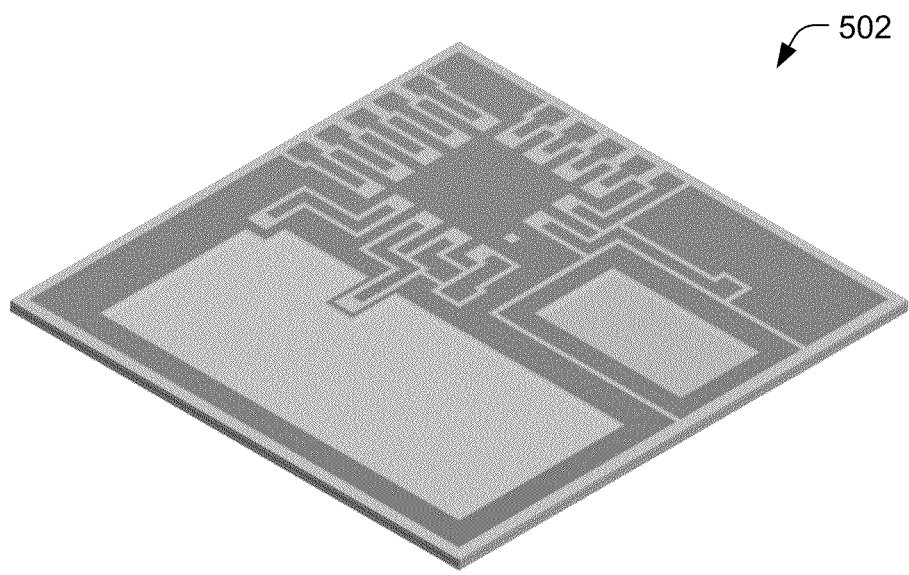
FIG. 5B is a perspective view of the example PCB assembly of FIG. 5A, showing a first etch to create circuit paths and expose the adhesive, according to an implementation.

At block 720, the process includes laminating the first conductive sheet, the first dielectric film, the spacer, the one or more electrical components, the second dielectric film, and the second conductive sheet to form a laminated structure (such as laminated structure 502, as shown in FIG. 5B, for example). In an implementation, the process includes increasing a fluidity of the adhesive and causing the adhesive to flow into voids of the laminated structure while laminating. For example, this may be accomplished using pressure or a combination of pressure and vacuum, or the like.

In an implementation, the process includes etching one or more outer surfaces of the laminated structure to form circuit paths on the one or more outer surfaces, as shown in FIG. 5B. The etching process may also open contact areas to the one or more electrical components bonded into the aperture(s) in the spacer and/or expose the adhesive within the apertures.

Figure 6A:
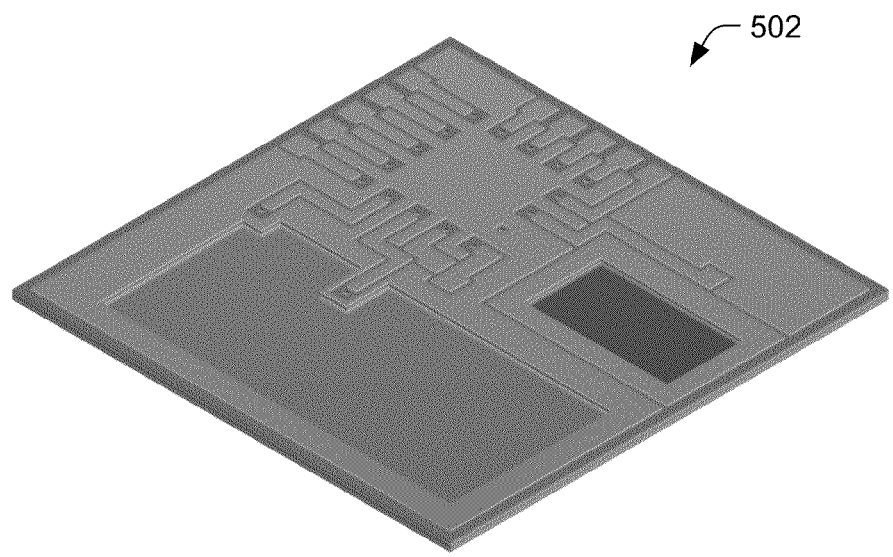
FIG. 6A is a perspective view of the PCB assembly of FIG. 5B, showing circuit paths after excess adhesive is removed, according to an implementation.
Figure 6B:
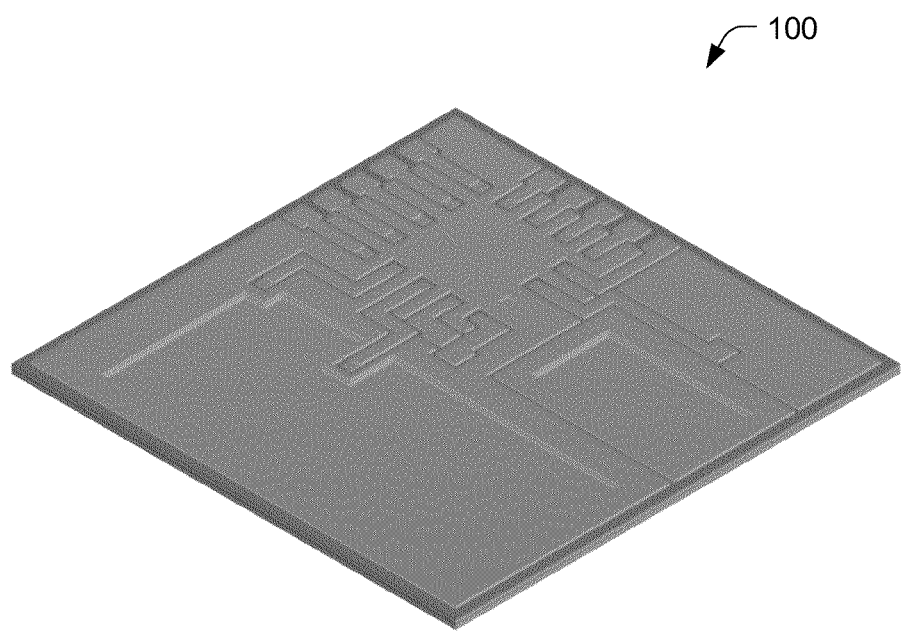
FIG. 6B is a perspective view of the example PCB assembly of FIG. 6A, showing the upper side of the multi-layer PCB, with plating and etching processes, according to an implementation.

In one implementation, the process includes removing the adhesive from any and/or all apertures in the first and/or second dielectric films. This is illustrated in FIG. 6A. In another implementation, the process includes plating one or more outer surfaces of the laminated structure to form contact paths to the one or more electrical components from one or more portions of at least the first or second conductive sheets. In an implementation, electroless plating may be used. Further, the contact paths may be augmented using a combination of electrolytic plating and etching, for example, to create a desired thickness and a desired path layout. Once contacts are completed, the resulting assembly is a PCB arrangement, or the like, as shown in FIG. 6B.

In one implementation, the process includes drilling one or more vias (such as vias 114, for example) through the laminated structure and plating the vias to electrically couple one or more nodes of the laminated structure. For example, some components may be mounted to one or more of the outer layers of the PCB arrangement. These components may be electrically coupled using vias, for example. In an implementation, the vias are electrically coupled to conductive contact paths formed on the outer layers, for example. The components may be electrically coupled to the contact paths on their respective layers.

FIG. 15 illustrates a second representative process 1500 for improving electrical access to an embedded electrical component (such as component 102, for example) located within a carrier (such as PCB arrangement 100, for example), according to various implementations. The process 1500 is described with reference to FIGS. 1 and 8-14. The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

Figure 8A:
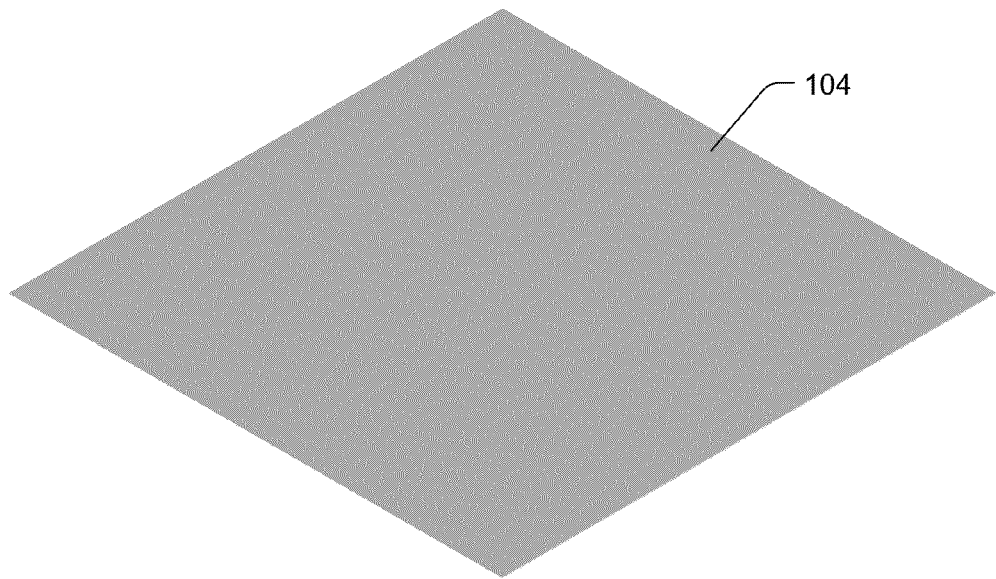
FIG. 8A is a perspective view of one of the PCB layers of FIG. 1, a first conductive layer, according to another implementation.
Figure 8B:
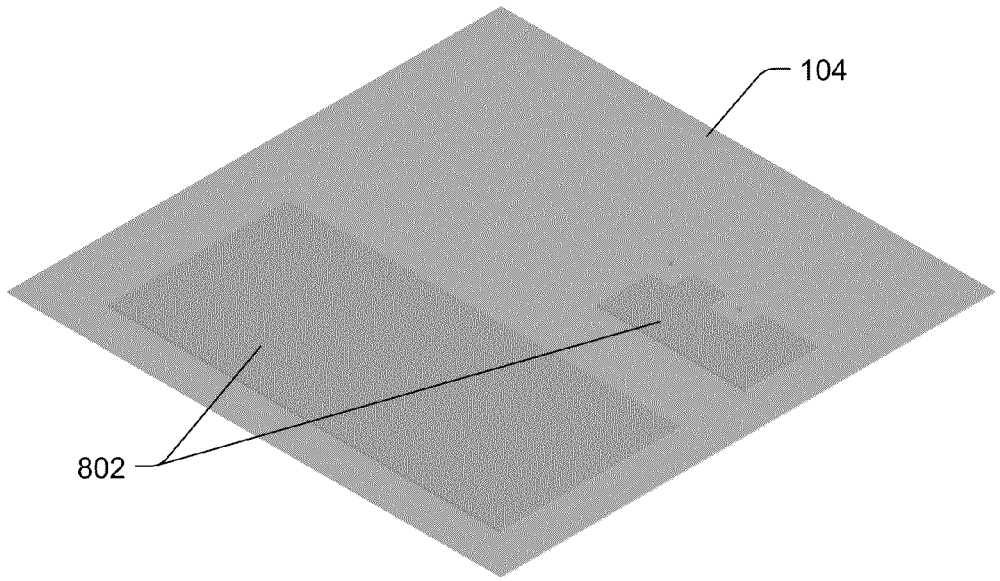
FIG. 8B is a perspective view of the conductive layer of FIG. 8A, with the addition of a set of forms to the conductive layer, according to the implementation.

At block 1502, the process includes depositing a first set of one or more forms (such as forms 802 as shown in FIG. 8B, for example) onto a surface of a first conductive layer (such as conductive layer 104, for example). In various implementations, the surface of the first conductive layer may be pre-treated to create a rough surface. This can have the benefit of improving adhesion of polymers to the roughened surface, for example.

Figure 9A:
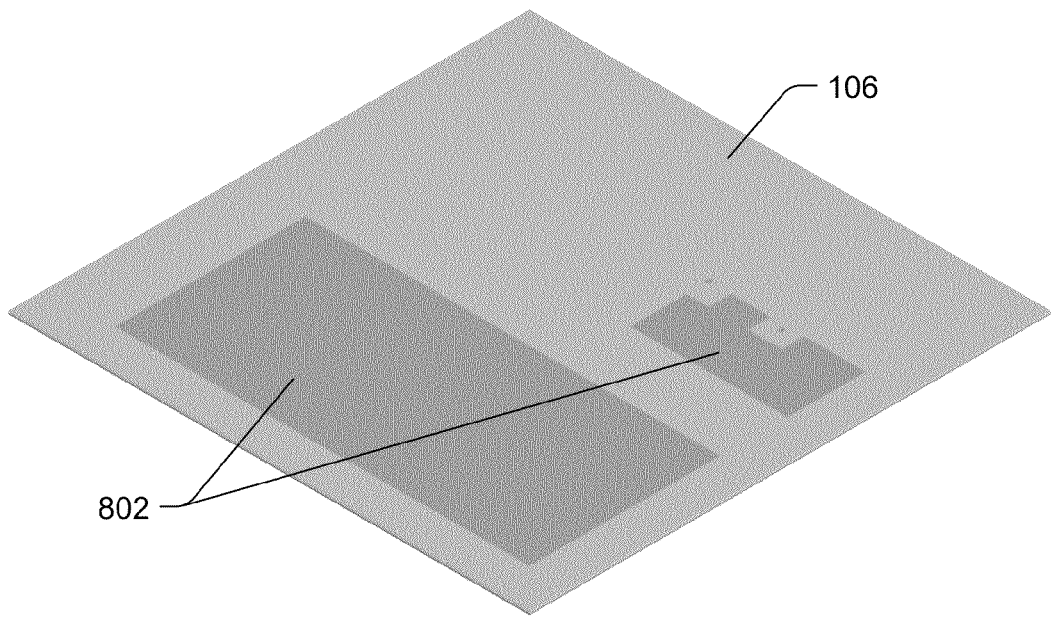
FIG. 9A is a perspective view of the example PCB assembly of FIG. 8B, with the addition of a deposited dielectric layer, according to the implementation.

At block 1504, the process includes depositing a first layer of dielectric material (such as dielectric layer 106, for example) onto the surface of the first conductive layer, around the first set of one or more forms, as shown in FIG. 9A, for example. In one implementation, the forms are a type of mold used to form apertures in the first layer of dielectric material. When the dielectric material cures, the forms may be removed to reveal the apertures. The apertures may serve as contact channels for embedded components, for example.

Figure 9B:
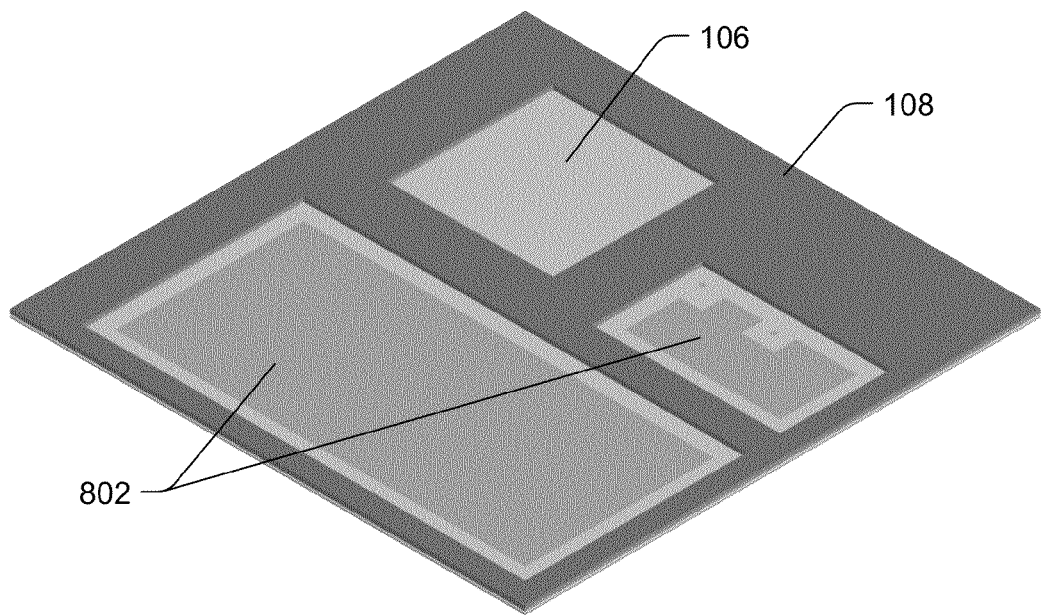
FIG. 9B is a perspective view of the example PCB assembly of FIG. 9A, with the addition of a spacer layer tacked to the dielectric layer, according to the implementation.

At block 1506, the process includes depositing a spacer layer (such as spacer layer 108, for example) having one or more apertures onto the dielectric material and the one or more forms, as shown in FIG. 9B, for example. In an implementation, the spacer is formed by depositing a layer of dielectric material. In alternate implementations, other materials may be used. In various implementations, the spacer layer may be pre-formed, including the apertures, prior to assembly at this stage. In an implementation, the spacer may have a thickness substantially the same as the components to be embedded, so that the layer is planar within the assembly when the components are added.

Figure 10A:
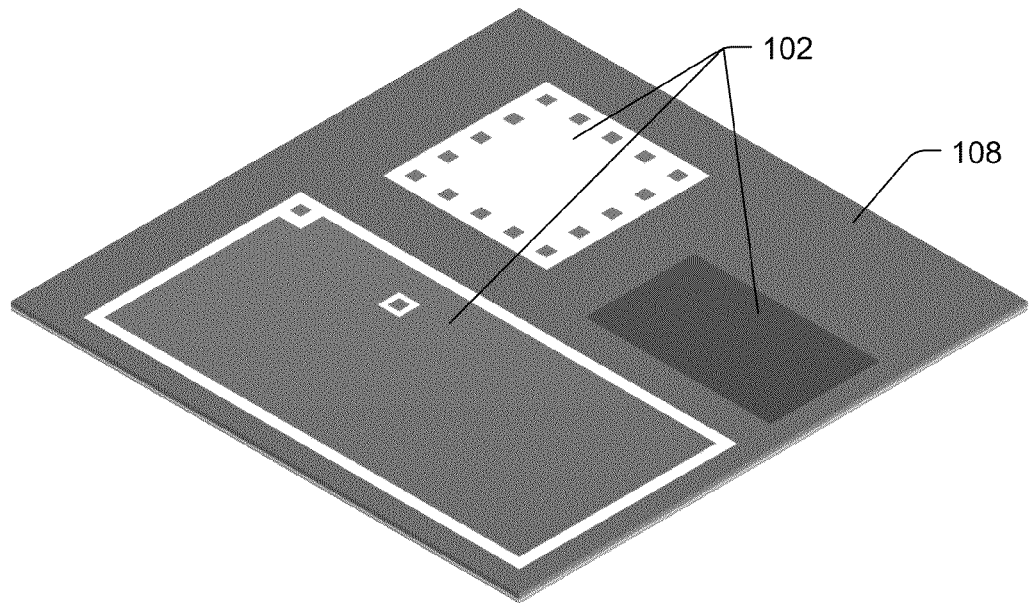
FIG. 10A is a perspective view of the PCB assembly of FIG. 9B, showing example electrical components bonded into apertures of the spacer layer, according to the implementation.

At block 1508, the process includes placing one or more electrical components (such as components 102, for example) into the one or more apertures in the spacer layer, as shown in FIG. 10A. In an implementation, the one or more electrical components are arranged to be electrically coupled to a portion of the first conductive layer via one or more apertures formed in the first layer of dielectric material, based on the first set of one or more forms.

Figure 10B:
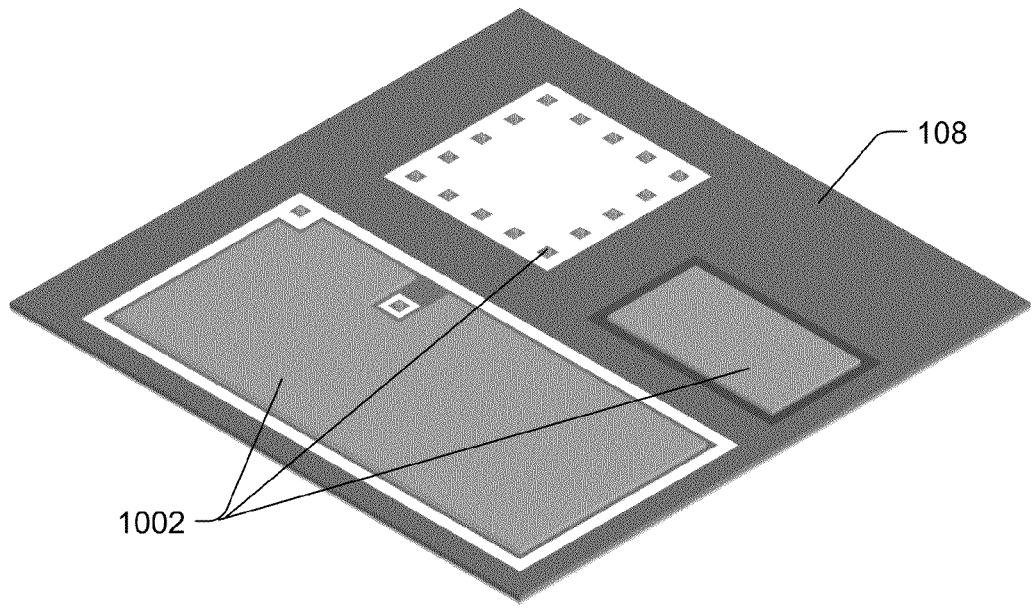
FIG. 10B is a perspective view of the example PCB assembly of FIG. 10A, showing a second set of forms added to the spacer/component layer, according to the implementation.
Figure 16:
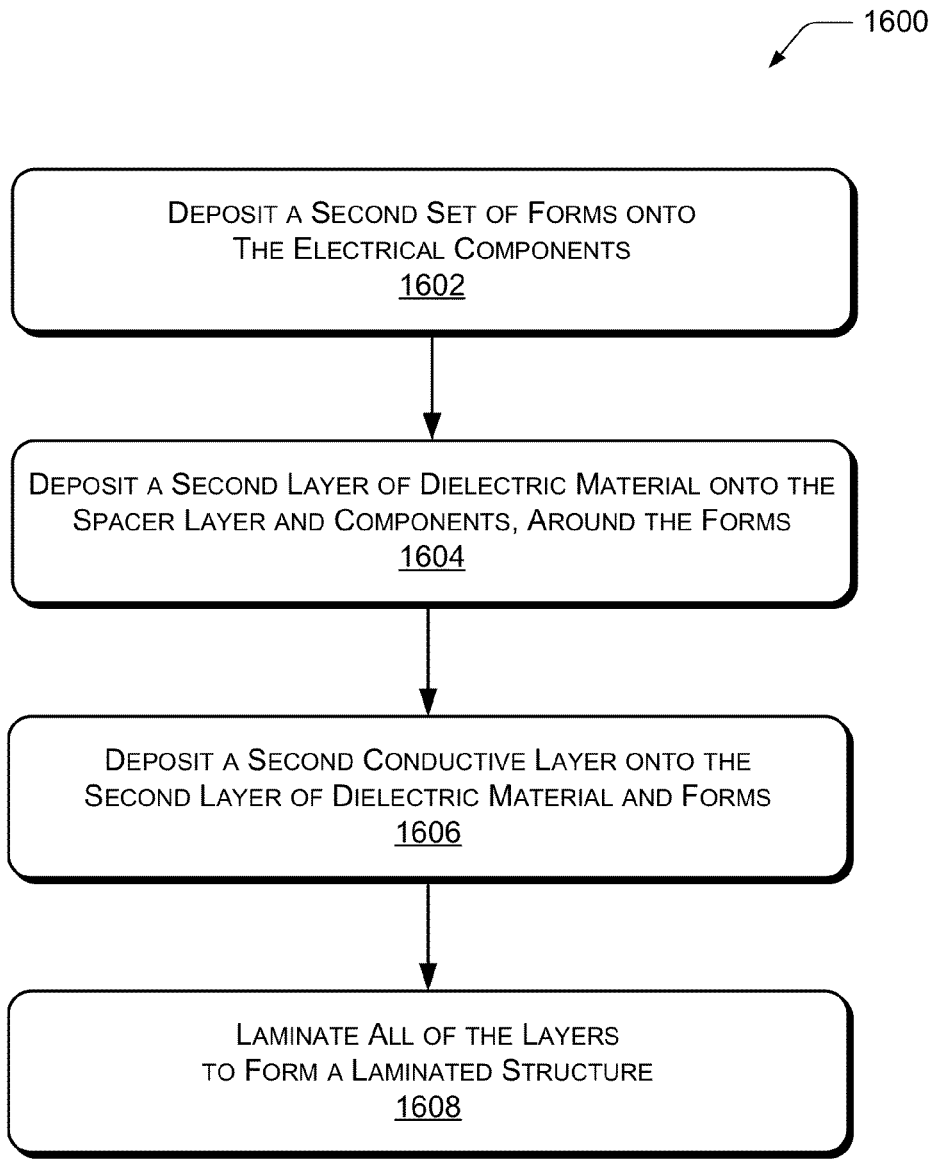
FIG. 16 is a flow diagram illustrating a first example process for continuing the process of FIG. 15, according to an implementation.

In one implementation, the process continues with the process 1600 of FIG. 16. In process 1600, the technique of adding new layers upon previous layers continues. At block 1602, the process includes depositing a second set of one or more form(s) (such as forms 1002, as shown in FIG. 10B, for example) onto the one or more electrical components. This second set of forms may be arranged to form apertures in a subsequent layer, for example, for connections to the embedded component(s).

Figure 11A:
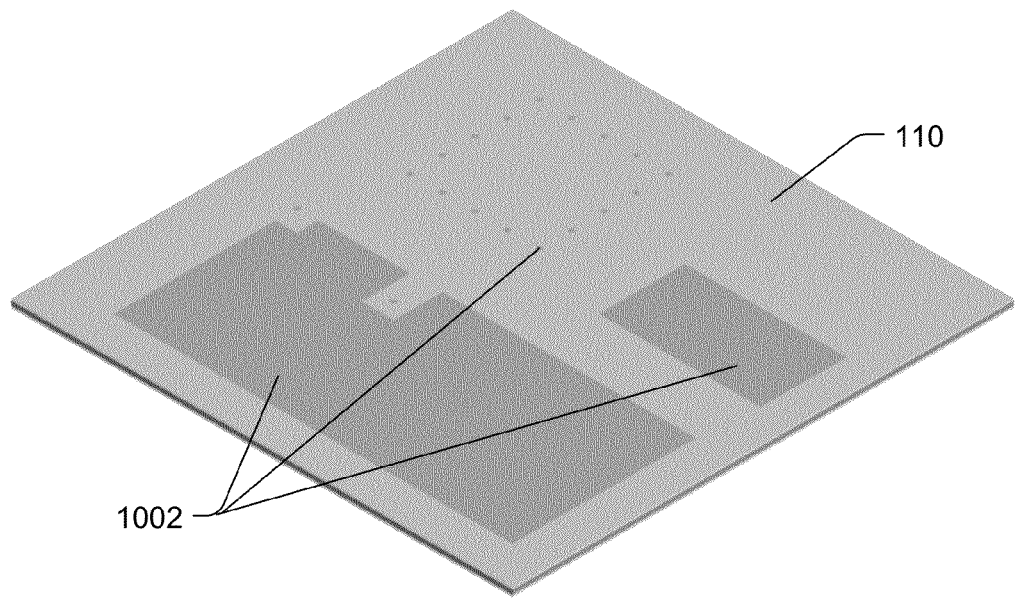
FIG. 11A is a perspective view of the PCB assembly of FIG. 10B, showing a second dielectric layer deposited onto the spacer layer, around the second set of forms, according to the implementation.

At block 1604, the process includes depositing a second layer of dielectric material (such as dielectric layer 110, for example) onto the spacer layer and the one or more electrical components, around the second set of forms, as shown in FIG. 11A.

Figure 11B:
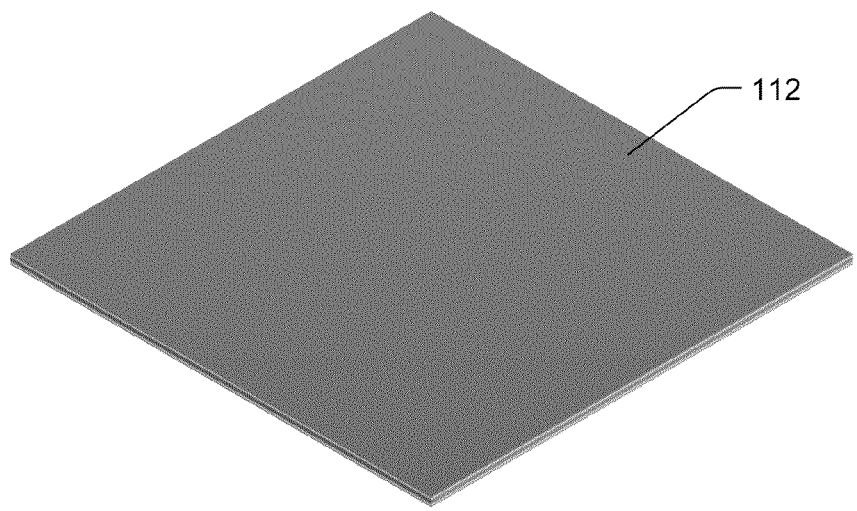
FIG. 11B is a perspective view of the PCB assembly of FIG. 11A, showing a second conductive layer tacked to the second dielectric layer, according to the implementation.

At block 1606, the process includes depositing a second conductive layer (such as conductive layer 112, for example) onto the second layer of dielectric material and the second set of one or more forms, as shown in FIG. 11B. Here also, the inside surface of the conductive layer may be roughened (or similar preparation) to improve adherence to the second layer of dielectric material.

At block 1608, the process includes laminating the first conductive layer, the first layer of dielectric material, the spacer layer, the one or more electrical components, the second layer of dielectric material, and the second conductive layer to form a laminated structure. For example, the assembly may be laminated in a bonding press, or the like. In an implementation, the electrical components are arranged to be electrically coupled to a portion of the second conductive layer via one or more apertures formed in the second layer of dielectric material based on the second set of forms.

Figure 17:
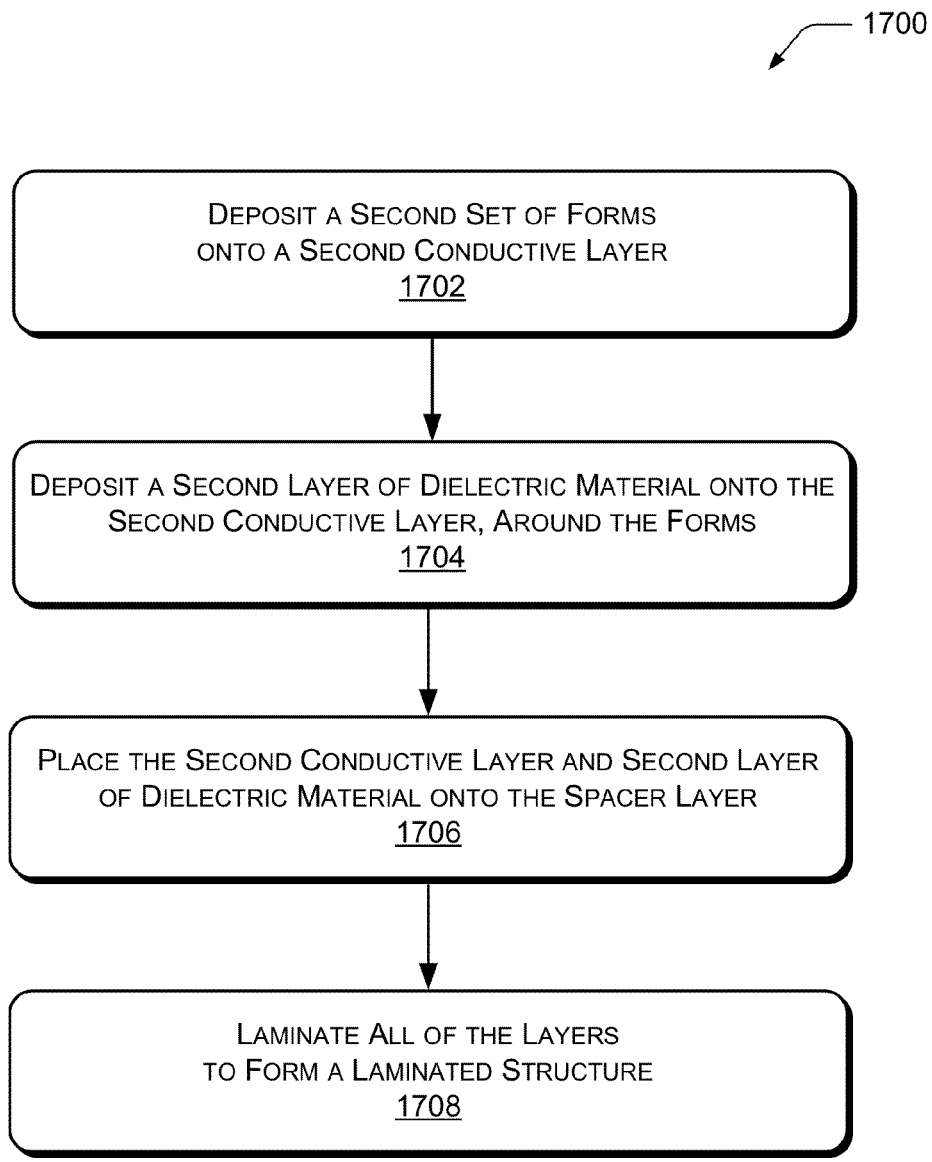
FIG. 17 is a flow diagram illustrating a second example process for continuing the process of FIG. 15, according to another implementation.

In another implementation, the process continues with the process 1700 of FIG. 17. In process 1700, the technique includes building a second assembly, and adding the second assembly to the previous assembly of process 1500. At block 1702, the process includes depositing a second set of one or more forms (such as forms 1002, as shown in FIG. 10B, for example) onto a surface of a second conductive layer (such as conductive layer 112, for example). The second conductive layer may be prepared (e.g., roughened, or the like) as mentioned above.

At block 1704, the process includes depositing a second layer of dielectric material (such as dielectric layer 110, for example) onto the second conductive layer, around the second set of forms. At block 1706, the process includes placing the second conductive layer and the second layer of dielectric material onto the spacer layer and the one or more electrical components. For example, the second assembly (comprising the second conductive layer and the second layer of dielectric material plus forms) is turned "dielectric side-down," and stacked onto the first assembly of layers formed in process 1500.

At block 1708, the process includes laminating the first conductive layer, the first layer of dielectric material, the spacer layer, the one or more electrical components, the second layer of dielectric material, and the second conductive layer to form a laminated structure. In an implementation, the electrical components are arranged to be electrically coupled to a portion of the second conductive layer via one or more apertures formed in the second layer of dielectric material based on the second set of one or more forms.

In an implementation, the process includes depositing the first layer of dielectric material and/or the second layer of dielectric material as a liquid or a semi-solid. For example, the first layer of dielectric material and/or the second layer of dielectric material can be cured to a substantially solid form as part of the process. In another implementation, the process includes depositing the first layer of dielectric material and/or the second layer of dielectric material using at least one of a flood coating process or a screen printing process.

In one implementation, the process includes removing the first set of forms and the second set of forms to create access channels for the embedded electrical components. For example, the forms may be developed out of the apertures (if the forms have been made using photo-active materials), creating openings from the component to the outer surfaces of the laminated structure.

Figure 12A:
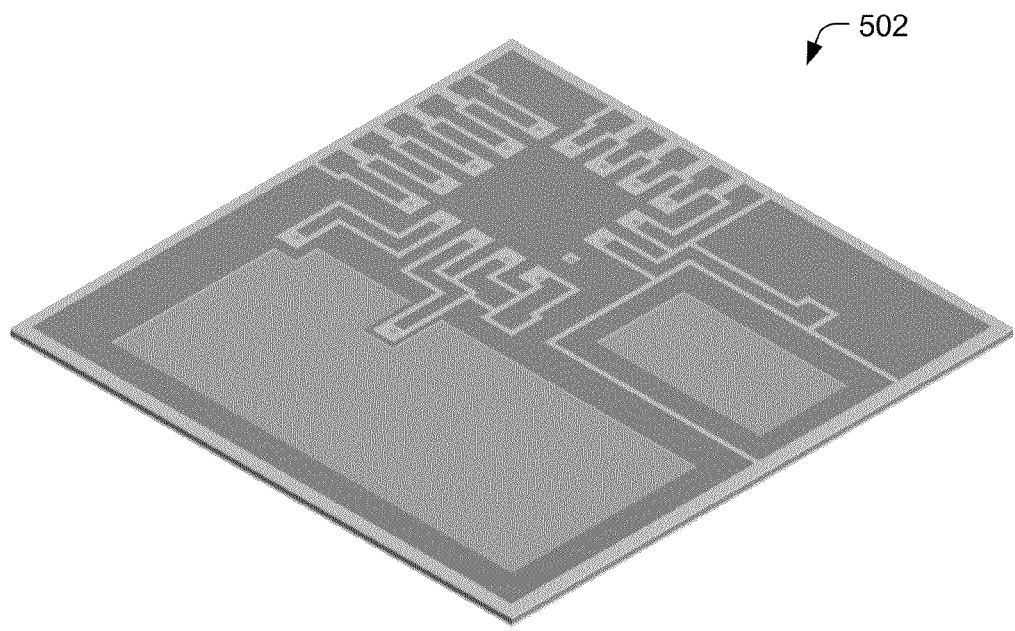
FIG. 12A is a perspective view of the example PCB assembly of FIG. 11B, showing a first etch to create circuit paths and expose the forms, according to the implementation.
Figure 12B:
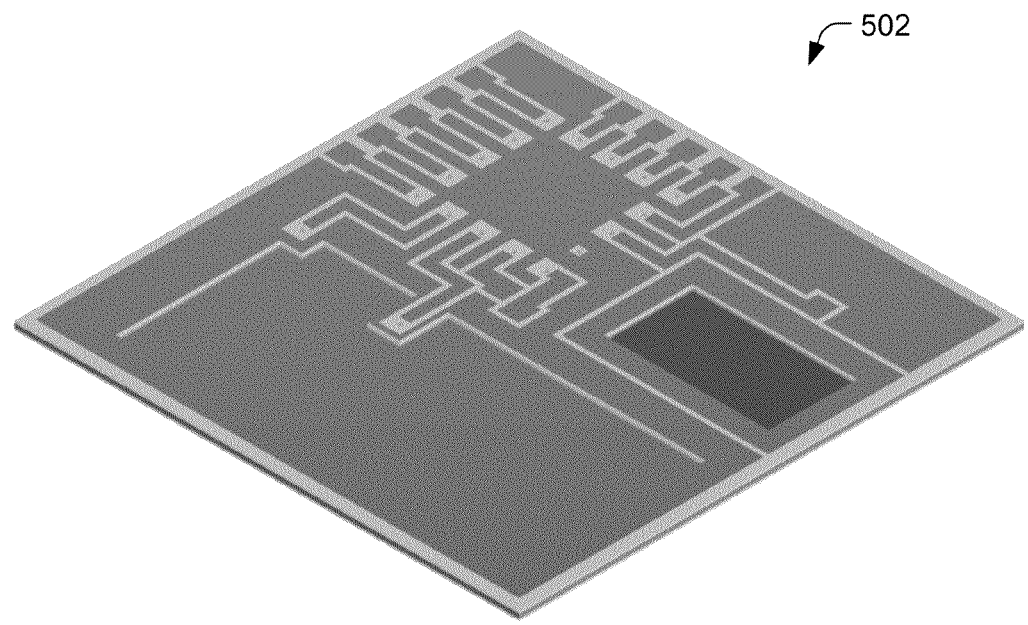
FIG. 12B is a perspective view of the PCB assembly of FIG. 12A on a first side, showing the forms removed, and the resulting apertures, according to the implementation.
Figure 13A:
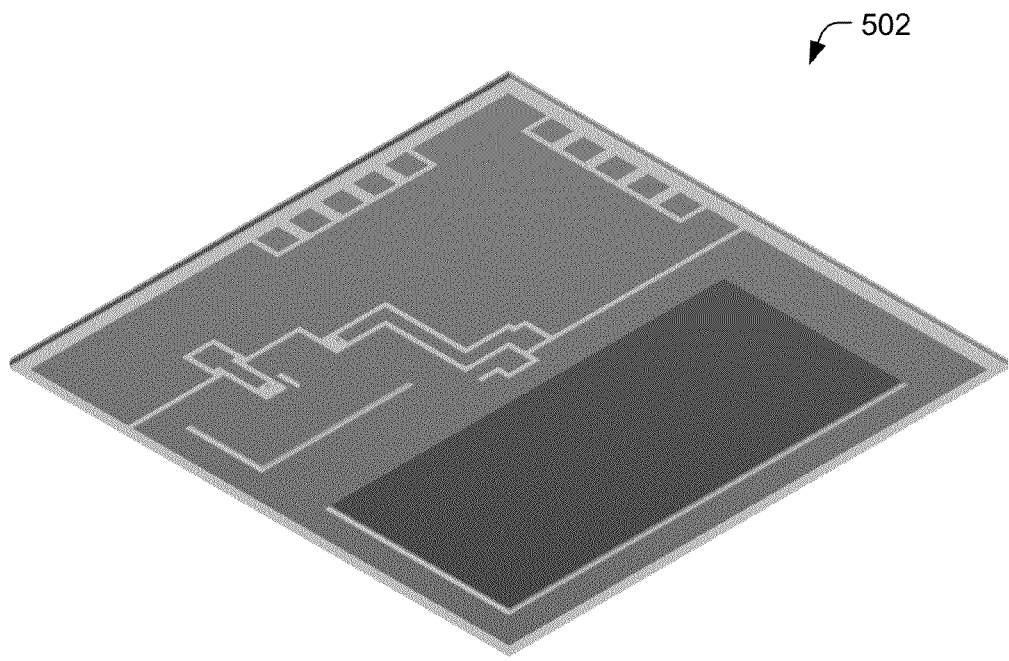
FIG. 13A is a perspective view of the PCB assembly of FIG. 12A on a second side, showing the forms removed, and the resulting apertures, according to the implementation.
Figure 13B:
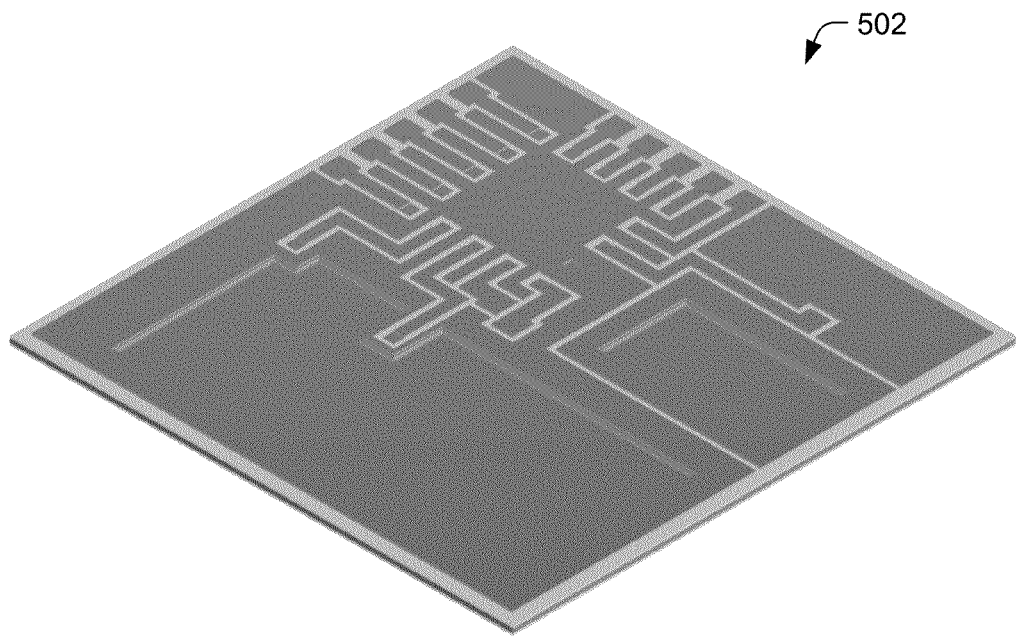
FIG. 13B is a perspective view of the example PCB assembly of FIG. 12B, showing the first side of the multi-layer PCB with plating and second etch process, according to the implementation.
Figure 14A:
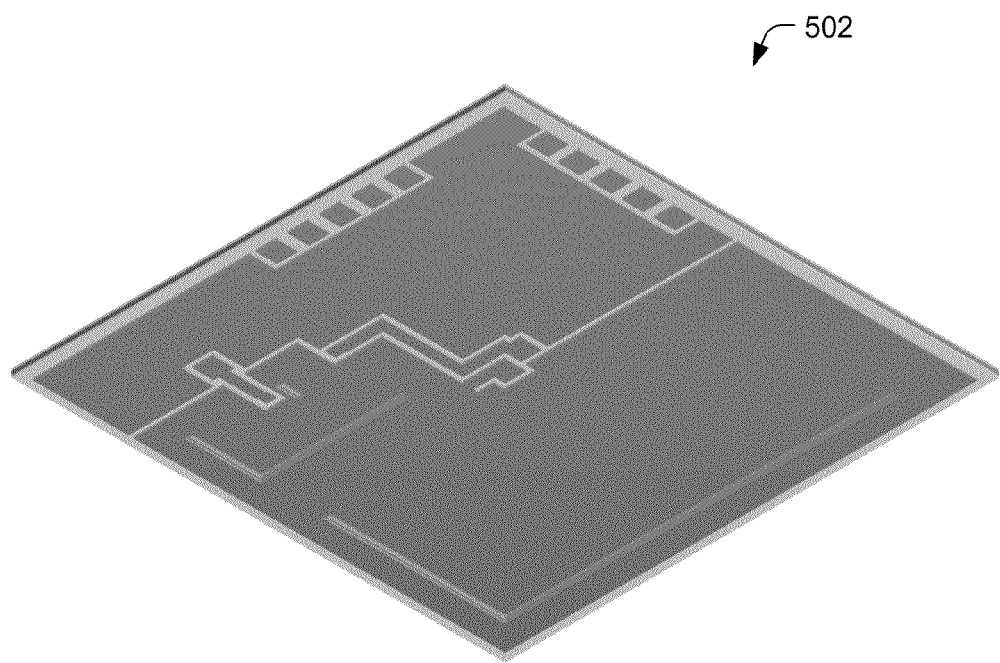
FIG. 14A is a perspective view of the example PCB assembly of FIG. 13A, showing the second side of the multi-layer PCB with plating and second etch process, according to the implementation.
Figure 14B:
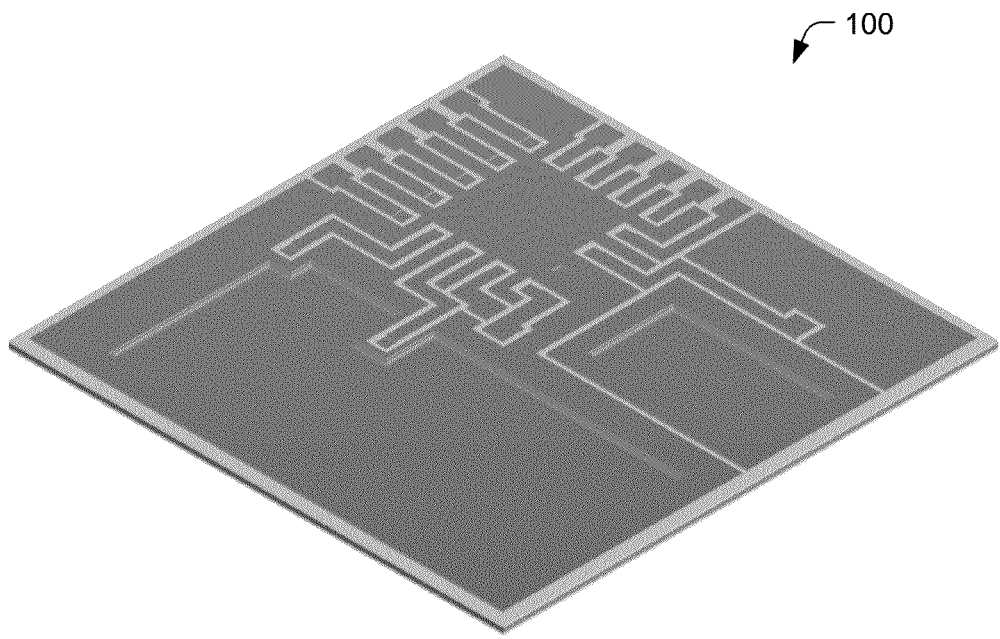
FIG. 14B is a perspective view of the example PCB assembly of FIG. 13B, showing the first side of the multi-layer PCB, according to the implementation.

In an implementation, the process includes etching one or more outer surfaces of the laminated structure to form circuit paths on the one or more outer surfaces, as shown in FIG. 12A. The circuit paths are created and the forms are exposed on the outer surfaces. Further, the etching can also open contact areas to the one or more electrical components placed into the apertures in the spacer layer. Additionally, the process includes removing the adhesive from apertures in the first and/or second dielectric films, as shown in FIG. 12B (one side) and 13A (the other side). In the implementation, the process includes plating (using electroless plating, for example) one or more outer surfaces (such as conductive layers 1014 and 112, for example) of the laminated structure to form contact paths to the one or more electrical components from portions of the first and/or second conductive layers. A second etch process may be used to maintain the circuit layout, for example. One benefit of a multi-plate and etch process, is that fine geometries can be maintained.

In an implementation, the process includes depositing one or more forms (at blocks 1502, 1602, and 1702, for example) using a screening process, a flood coating process, a jetting process, a dispensing process, a photo-imaging process, or the like. In various implementations, the forms may be comprised of an epoxy resin material or an ultra-violet (UV) exposing acrylate material, for example.

In alternate implementations, other techniques may be included in the processes 700, 1500, 1600, and 1700, in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:
1. A method, comprising:
depositing a first set of one or more forms onto a surface of a first conductive layer;
depositing a first layer of dielectric material onto the first conductive layer, around the first set of one or more forms;
depositing a spacer layer having one or more apertures onto the dielectric material and the one or more forms; and
placing one or more electrical components into the one or more apertures in the spacer layer, the one or more electrical components arranged to be electrically coupled to a portion of the first conductive layer via one or more apertures formed in the first layer of dielectric material, based on the first set of one or more forms.

2. The method of claim 1, further comprising:

depositing a second set of one or more form(s) onto the one or more electrical components;

depositing a second layer of dielectric material onto the spacer layer and the one or more electrical components, around the second set of one or more forms;

depositing a second conductive layer onto the second layer of dielectric material and the second set of one or more forms; and laminating the first conductive layer, the first layer of dielectric material, the spacer layer, the one or more electrical components, the second layer of dielectric material, and the second conductive layer to form a laminated structure, the one or more electrical components arranged to be electrically coupled to a portion of the second conductive layer via one or more apertures formed in the second layer of dielectric material based on the second set of one or more forms.

3. The method of claim 1, further comprising:

depositing a second set of one or more forms onto a surface of a second conductive layer;

depositing a second layer of dielectric material onto the second conductive layer, around the second set of one or more forms;

placing the second conductive layer and the second layer of dielectric material onto the spacer layer and the one or more electrical components; and laminating the first conductive layer, the first layer of dielectric material, the spacer layer, the one or more electrical components, the second layer of dielectric material, and the second conductive layer to form a laminated structure, the one or more electrical components arranged to be electrically coupled to a portion of the second conductive layer via one or more apertures formed in the second layer of dielectric material based on the second set of one or more forms.

4. The method of claim 2, further comprising depositing the first layer of dielectric material and/or the second layer of dielectric material as a liquid or a semi-solid, and curing the first layer of dielectric material and/or the second layer of dielectric material to a substantially solid form.

5. The method of claim 2, further comprising depositing the first layer of dielectric material and/or the second layer of dielectric material using at least one of a flood coating process or a screen printing process.

6. The method of claim 2, further comprising:

etching one or more outer surfaces of the laminated structure to form circuit paths on the one or more outer surfaces and/or to open contact areas to the one or more electrical components placed into the one or more apertures in the spacer layer;

removing the adhesive from apertures in the first and/or second dielectric films; and plating one or more outer surfaces of the laminated structure to form contact paths to the one or more electrical components from one or more portions of at least the first or second conductive layers.

7. The method of claim 2, further comprising depositing the one or more forms using at least one of a screening process, a flood coating process, a jetting process, a dispensing process, or a photo-imaging process.

8. The method of claim 2, wherein the one or more forms are comprised of an epoxy resin material or an ultra-violet (UV) exposing acrylate material.

9. The method of claim 2, further comprising removing the first set of forms and the second set of forms to create access channels for the one or more electrical components.

* * * * *